United States Patent
Johnson et al.

(10) Patent No.: US 9,671,427 B2
(45) Date of Patent: Jun. 6, 2017

(54) DUAL OUTPUT HIGH VOLTAGE ACTIVE PROBE WITH OUTPUT CLAMPING AND ASSOCIATED METHODS

(71) Applicant: Keysight Technologies, Inc., Minneapolis, MN (US)

(72) Inventors: Kenneth W. Johnson, Colorado Springs, CO (US); Edward Vernon Brush, IV, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/001,173

(22) Filed: Jan. 19, 2016

(65) Prior Publication Data

US 2016/0139178 A1 May 19, 2016

Related U.S. Application Data

(63) Continuation-in-part of application No. 13/869,774, filed on Apr. 24, 2013, now Pat. No. 9,423,422.

(51) Int. Cl.
*G01R 31/20* (2006.01)
*G01R 1/067* (2006.01)
(Continued)

(52) U.S. Cl.
CPC ......... *G01R 1/067* (2013.01); *G01R 1/06766* (2013.01); *G01R 1/20* (2013.01);
(Continued)

(58) Field of Classification Search
CPC ....... H01L 2924/00; H01L 2924/00014; H01L 2924/0002; H01L 2224/05599; H03K 5/08; G01R 1/06766; G01R 1/20
(Continued)

(56) References Cited

U.S. PATENT DOCUMENTS

| 4,704,575 A | 11/1987 | Arnoux et al. |
| 5,696,773 A | 12/1997 | Miller |

(Continued)

FOREIGN PATENT DOCUMENTS

WO 2011135094 A1 11/2011

OTHER PUBLICATIONS

Circuits Today, "Diode Clamping Circuit", http://www.circuitstoday.com/diode-clamping-circuits; Mar. 28, 2011.
(Continued)

*Primary Examiner* — Jermele M Hollington
*Assistant Examiner* — Raul Rios Russo

(57) ABSTRACT

A high-voltage active measurement probe is for a measurement instrument such as an oscilloscope. The high voltage active measurement probe includes an input terminal configured to receive an input signal from a device under test (DUT), a first output terminal configured to transmit a first output signal to the measurement instrument for measurement and display of peak voltages, and a second output terminal configured to transmit a second output signal to the measurement instrument for high sensitivity measurement and display of low level voltages. A first probe signal path is between the input terminal and the first output terminal, and a second probe signal path between the input terminal and the second output terminal. A first amplifier is in the first probe signal path between the input terminal and the first output terminal, and a second amplifier is in the second probe signal path between the input terminal and the second output terminal. A first attenuator is in the first probe signal path between the input terminal and the first amplifier, and a second attenuator in the second probe signal path between the input terminal and the second amplifier. A clamping circuit is in the second signal path between the second amplifier and the second output terminal and configured to (Continued)

clamp an internal probe signal, e.g. between an upper clamping threshold and a lower clamping threshold, to produce the second output signal.

20 Claims, 5 Drawing Sheets

(51) Int. Cl.
    *G01R 1/30*             (2006.01)
    *G01R 1/20*             (2006.01)

(52) U.S. Cl.
    CPC ............ *G01R 1/30* (2013.01); *G01R 1/06788* (2013.01); *H01L 2924/00* (2013.01); *H01L 2924/0002* (2013.01)

(58) Field of Classification Search
    USPC ......... 324/71, 378, 403, 415, 425, 500, 537, 324/754, 754.01
    See application file for complete search history.

(56) References Cited

U.S. PATENT DOCUMENTS

| | | | |
|---|---|---|---|
| 6,225,972 | B1 | 5/2001 | Taraki et al. |
| 7,116,120 | B1 | 10/2006 | Cannon |
| 7,139,669 | B2 | 11/2006 | Tallman |
| 7,162,375 | B2 | 1/2007 | Van Epps et al. |
| 7,626,456 | B2 | 12/2009 | Calo |
| 7,733,105 | B2 | 6/2010 | Nozaki et al. |
| 8,648,629 | B2 | 2/2014 | Rossi |
| 2004/0227556 | A1 | 11/2004 | Ohmori |
| 2005/0208911 | A1 | 9/2005 | Petersen |
| 2007/0115022 | A1 | 5/2007 | Hemminger |
| 2008/0090545 | A1 | 4/2008 | Tokairin et al. |
| 2008/0309355 | A1 | 12/2008 | Nozaki et al. |
| 2009/0086395 | A1 | 4/2009 | Skrenes |
| 2011/0074389 | A1* | 3/2011 | Knierim ............ G01R 1/06788 324/76.39 |
| 2012/0268092 | A1 | 10/2012 | Rossi |
| 2012/0268200 | A1 | 10/2012 | Rossi |
| 2013/0049783 | A1 | 2/2013 | Driesen et al. |
| 2014/0145781 | A1* | 5/2014 | Taylor .................. H03K 17/302 327/427 |
| 2014/0320145 | A1 | 10/2014 | Johnson et al. |
| 2014/0320157 | A1 | 10/2014 | Brush, IV et al. |
| 2015/0002136 | A1 | 1/2015 | McTigue et al. |

OTHER PUBLICATIONS

Lemmon, "What is a clamp circuit?", http://www3.nd.edu/~lemmon/courses/ee224/web-manual/web-manual/lab5/node9.html, Feb. 1, 2009.

Office Action mailed Feb. 5, 2015 in co-pending U.S. Appl. No. 13/869,774.

Office Action mailed Sep. 10, 2015 in co-pending U.S. Appl. No. 13/869,774.

Notice of Allowance mailed Dec. 24, 2015 in co-pending U.S. Appl. No. 13/869,774.

Notice of Allowance mailed Apr. 19, 2016 in co-pending U.S. Appl. No. 13/869,774.

* cited by examiner

DUAL OUTPUT HIGH VOLTAGE ACTIVE PROBE WITH OUTPUT CLAMPING AND ASSOCIATED METHODS

RELATED APPLICATIONS

The present application is a continuation-in-part application under 37 C.F.R. §1.53(b) of commonly owned U.S. patent application Ser. No. 13/869,774, entitled "Oscilloscope Probe Having Output Clamping Circuit," filed on Apr. 24, 2013, which is hereby specifically incorporated by reference.

BACKGROUND

To design, characterize, and troubleshoot devices and systems (e.g. a device under test (DUT)), engineers need to measure a variety of characteristics of the device signals. To make such measurements, engineers generally use electronic test equipment such as an oscilloscope or network analyzer, a data acquisition (DAQ) instrument, digital multimeter (DMM), etc. and an associated probing system and display.

An oscilloscope is a type of electronic test instrument that allows observation of time-varying electrical signals. During typical operation, an oscilloscope receives an input signal through an oscilloscope probe connected to the DUT and displays the received signal on an electronic display. A test probe is a physical device that connects the test equipment to the DUT.

Oscilloscope probes include passive and active probes. Passive scope probes do not include active electronic parts, such as transistors, so they do not require external power. Active scope probes use a high-impedance high-frequency amplifier mounted in the probe head, and a screened lead. The purpose of the amplifier may be isolation (buffering) between the DUT and the oscilloscope and cable, loading the circuit with only a low capacitance and high DC resistance, and matching the oscilloscope input.

A high voltage probe allows for measuring voltages that would otherwise be too high to measure or even destructive. A high voltage probe reduces the input voltage to a safe, measurable level, e.g. with a voltage divider circuit within the probe body.

Many high voltage applications such as switch mode power supplies, power inverters, motor controllers et cetera have, as part of their function, a rapidly changing voltage that can have a ratio of 100:1, 1000:1, 10,000:1 (or higher) between high and low levels. This voltage is usually accompanied by a rapidly changing current that has the same period. The product of the voltage and current, V*I, of these, signals represents the power lost during power conversion. Typically, to measure these voltages users employ a high voltage differential probe.

Users have traditionally focused their attention to the transitions of the signals from high/low and low/high. However, with faster switching power semiconductors, users would like to accurately measure the voltage during the low portion of the cycle. This traditionally has been very difficult to measure accurately because of the large dynamic range of the voltage. For example, if Vmax is 1000V then the oscilloscope will be set to about 200V/division. At these settings, typical oscilloscope sensitivity is about 10V. The actual voltage during these transitions is typically less than 1V. If the user were to change the sensitivity of the oscilloscope to a higher sensitivity, the measurement may be compromised because the signal will overdrive the oscilloscope inputs and a distorted signal will be displayed. This prevents users from accurately measuring the low (or high) voltages.

In view of the above and other shortcomings of conventional approaches, there may be a general need for approaches and technologies in high voltage level applications to accurately measure and view peak voltages while also providing high sensitivity measurement and display of low level voltages using a large dynamic range probe output.

SUMMARY

The present embodiments provide approaches to accurately measure and view peak voltages while also providing high sensitivity measurement and display of low level voltages using a large dynamic range probe output.

The present embodiments may provide a dual output high voltage active probe with output clamping.

In accordance with a representative embodiment, a high-voltage active measurement probe for a measurement instrument is provided. The high voltage active measurement probe includes an input terminal configured to receive an input signal from a device under test (DUT), a first output terminal configured to transmit a first output signal to the measurement instrument for measurement and display of peak voltages, a second output terminal configured to transmit a second output signal to the measurement instrument for high sensitivity measurement and display of low level voltages, a first probe signal path between the input terminal and the first output terminal, and a second probe signal path between the input terminal and the second output terminal. A first amplifier is in the first probe signal path between the input terminal and the first output terminal, and a second amplifier is in the second probe signal path between the input terminal and the second output terminal. A first attenuator is in the first probe signal path between the input terminal and the first amplifier, and a second attenuator in the second probe signal path between the input terminal and the second amplifier. A clamping circuit is in the second signal path between the second amplifier and the second output terminal and configured to clamp an internal probe signal, e.g. between an upper clamping threshold and a lower clamping threshold, to produce the second output signal.

In certain embodiments, the measurement instrument is an oscilloscope.

In certain embodiments, the upper clamping threshold corresponds to a positive voltage level and the lower clamping threshold corresponds to a negative voltage level.

In certain embodiments, the clamping circuit includes a first precision rectifier configured to clamp a positive voltage portion of the internal probe signal to produce a first intermediate signal, a first level shifter configured to adjust a direct current (DC) bias of the first intermediate signal to produce a second intermediate signal, a second precision rectifier configured to clamp a negative voltage portion of the internal probe signal to produce a third intermediate signal, and a second level shifter configured to adjust a DC bias of the third intermediate signal to produce the second output signal.

In certain embodiments, each of the first precision rectifier, the first level shifter, the second precision rectifier, and the second level shifter comprises an amplifier arranged in an inverting configuration.

In certain embodiments, the first precision rectifier is configured to perform clamping on the positive voltage portion by adjusting a DC bias of the internal probe signal, inverting the internal probe signal, and clamping a negative voltage portion of the adjusted and inverted internal probe signal.

In certain embodiments, an additional input terminal is coupled to each of the first and second probe signal paths, and together with the input terminal defining a differential input.

In certain embodiments, the first amplifier has a first gain and a first bandwidth, and the second amplifier has a second gain higher than the first gain and a second bandwidth lower than the first bandwidth.

In certain embodiments, switch circuitry is coupled to the first and second probe signal paths to selectively switch the first and second output terminals therebetween.

Another embodiment is directed to a measurement system that includes a measurement instrument comprising at least first and second channel inputs and a display, and a high-voltage active measurement probe. The probe includes an input terminal configured to receive an input signal from a device under test (DUT), a first output terminal configured to transmit a first output signal to the first channel input of the measurement instrument for measurement and display of peak voltages, a second output terminal configured to transmit a second output signal to the second channel input of the measurement instrument for high sensitivity measurement and display of low level voltages, a first probe signal path between the input terminal and the first output terminal, and a second probe signal path between the input terminal and the second output terminal. A first amplifier is in the first probe signal path between the input terminal and the first output terminal, and a second amplifier is in the second probe signal path between the input terminal and the second output terminal. A first attenuator is in the first probe signal path between the input terminal and the first amplifier, and a second attenuator is in the second probe signal path between the input terminal and the second amplifier. A clamping circuit is in the second signal path between the second amplifier and the second output terminal and configured to clamp an internal probe signal, e.g. between an upper clamping threshold and a lower clamping threshold, to produce the second output signal.

Another embodiment is directed to a method of operating a high-voltage active measurement probe, the method including positioning the high-voltage active measurement probe and receiving an input signal from a device under test (DUT), and processing the input signal along a first probe signal path, including attenuation and amplification, to produce a first output signal to the measurement instrument for measurement and display of peak voltages. The method includes processing the input signal along a second probe signal path, including attenuation, amplification and clamping of an internal probe signal between an upper clamping threshold and a lower clamping threshold, to produce a second output signal to the measurement instrument for high sensitivity measurement and display of low level voltages.

In certain embodiments, processing the input signal to produce the first output signal further comprises transmitting the input signal through the first probe signal path including a first attenuator and a first amplifier; and wherein processing the input signal to produce the second output signal further comprises transmitting the input signal through the second probe signal path including a second attenuator, a second amplifier having higher gain and lower bandwidth than the first operational amplifier, and clamping circuit.

In certain embodiments, the clamping comprises: inverting the input signal and shifting a direct current (DC) bias of the input signal; clamping a negative portion of the inverted and shifted input signal to produce a first intermediate signal; inverting the first intermediate signal and shifting a DC bias of the inverted first intermediate signal to produce a second intermediate signal; inverting the second intermediate signal and shifting a DC bias of the second intermediate signal; clamping a positive portion of the inverted and shifted second intermediate signal to produce a third intermediate signal; and inverting the third intermediate signal and shifting a DC bias of the inverted third intermediate signal.

In certain embodiments, the high-voltage active measurement probe further comprises first and second input terminals coupled to each of the first and second probe signal paths, and together defining a differential input.

The embodiments of the present invention include the use of a high voltage measurement probe that includes a second output. A second signal path is routed to a second output connector on the probe. The second output has a clamping circuit that will limit its output to a range corresponding to the vertical range of the oscilloscope at its highest sensitivity, e.g. approximately 5-10 volts. With a probe equipped in this manner the user will measure the peak voltages using the primary output. The second output will be connected to a second oscilloscope channel. This channel will be able to be set to its highest sensitivity and measure the low level voltage (or high level voltage) without concern for overdriving the input circuitry of the oscilloscope.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
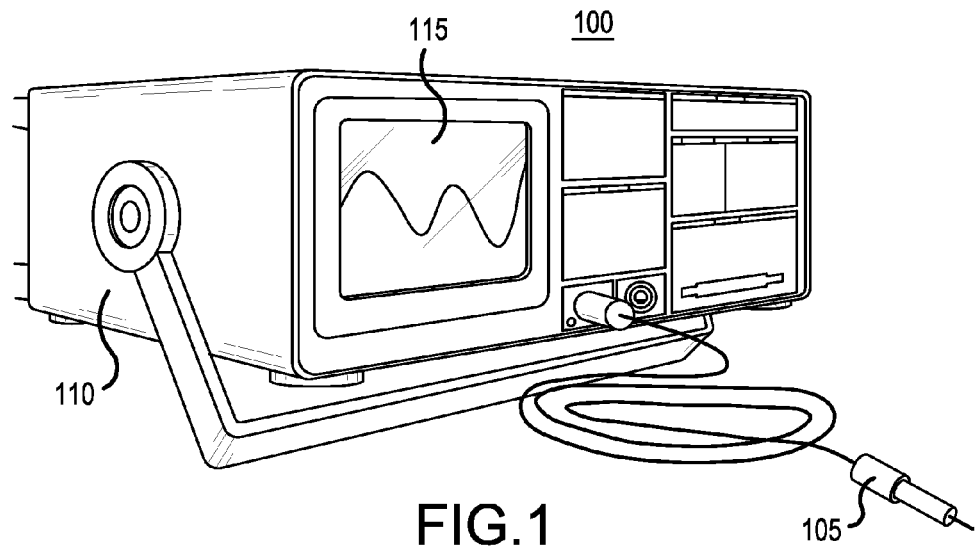
FIG. 1 is a schematic diagram of an oscilloscope and dual output high voltage active oscilloscope probe according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" another element, it can be directly connected or coupled, or intervening elements may be present.

Initially, it is pointed out that to design, characterize, and troubleshoot devices and systems (e.g. a device under test (DUT)), engineers need to measure a variety of characteristics of the device signals. To make such measurements, engineers generally use a network analyzer or oscilloscope, a data acquisition (DAQ) instrument, digital multimeter (DMM), etc. and an associated probing system and display.

Although several embodiments are described with reference to oscilloscopes and oscilloscope probe, the described concepts are not limited to oscilloscope technologies and can be applied in other contexts, such as other forms of test or measurement instruments. The described clamping circuits, for instance, could be applied in any context where it is desirable to perform clamping with linear gain and amplitude between the clamping thresholds.

FIG. 1 is a schematic diagram of an oscilloscope and dual output high voltage active oscilloscope probe according to a representative embodiment. This diagram is presented to illustrate an example context in which output clamping may be applied to a dual output high voltage active oscilloscope probe.

Referring to FIG. 1, a measurement system 100 comprises a dual output high voltage active oscilloscope probe 105 and an oscilloscope 110. During typical operation of measurement system 100, a user applies a probe tip of oscilloscope probe 105 to a test point of a DUT. Upon making contact with the test point, oscilloscope probe 105 detects a voltage signal at the test point and transmits the voltage signal along two paths to oscilloscope 110. Oscilloscope 110 then converts the signals into a waveform to be displayed on a display 115.

Oscilloscope probe 105 can take a variety of alternative forms. For instance, it may be a single ended probe or a differential probe. Additionally, although oscilloscope probe 105 is shown as a single lead with a single probe head and tip, it could alternatively be implemented with multiple leads to be connected to a DUT, for instance. Oscilloscope probe 105 typically receives an input signal from the DUT, processes the input signal (e.g., by amplification in an active probe), and then clamps the value along one path of the processed input voltage signal to produce multiple output signals.

Oscilloscope 110 receives the output signals of oscilloscope probe 105 as input signals and performs processing on the received input signals. This processing may include, for instance, amplification by an input amplifier and digitization by an ADC. The digitization produces a stream of digital values to be presented on display 115. The input amplifier and/or ADC are typically configured to amplify and/or digitize signals according to a range of values that can be presented on display 115. This range, also referred to as the "full screen range" of display 115, is typically specified by a number of vertical divisions of display 115 and a number of volts per division (V/div). This range can be adjusted by changing the attenuation of oscilloscope probe 105 and/or the input amplifier, for example. In a typical implementation, the full screen range is slightly lower than the dynamic range of the input amplifier and ADC, so these components do not immediately saturate when the input voltage of oscilloscope 110 exceeds the full screen range. For instance, if the dynamic range of the input amplifier and ADC is set to 10V, the full screen range may be set to 8V.

The input amplifier of oscilloscope 110 may be protected by an overdrive protection circuit that is activated when the input signal of oscilloscope 110 exceeds the dynamic range of the input amplifier. The operation of the overdrive protection circuit, however, may introduce distortion into signals that do not exceed the dynamic range of the input amplifier. This distortion is typically present during a period of overdrive recovery following deactivation of the overdrive protection circuit. In general, the distortion may interfere with the observation and measurement of signals of interest. To prevent such interference, oscilloscope probe 105 includes an output clamping circuit along one path that restricts its output to within the dynamic range of the input amplifier of oscilloscope 110, effectively preventing the overdrive recovery circuit from being activated. Examples of such an output clamping circuit, along with further details of its operation, are described below with reference to other figures.

Figure 2:
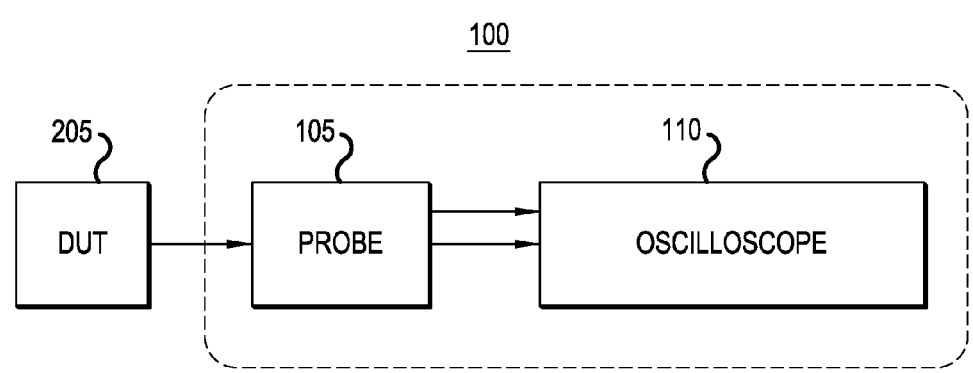
FIG. 2 is a block diagram of the oscilloscope and dual output high voltage active oscilloscope probe of FIG. 1 according to a representative embodiment.

FIG. 2 is a block diagram of oscilloscope 110 and dual output high voltage active oscilloscope probe 105 of FIG. 1 according to a representative embodiment. This diagram is presented as a simple illustration of the signal flow from a DUT 205 to oscilloscope 110.

Referring to FIG. 2, where oscilloscope probe 105 is in contact with DUT 205, a voltage signal is transmitted from DUT 205 to oscilloscope probe 105 along two paths. The signal is transmitted to oscilloscope 110 where it is amplified, digitized, and presented on display 115.

Figure 3A:
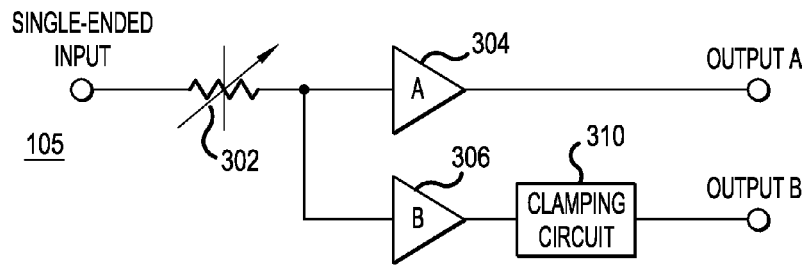
FIGS. 3A and 3B are detailed circuit diagrams of a dual output high voltage active oscilloscope probe of FIG. 1 according to representative embodiments.
Figure 3B:
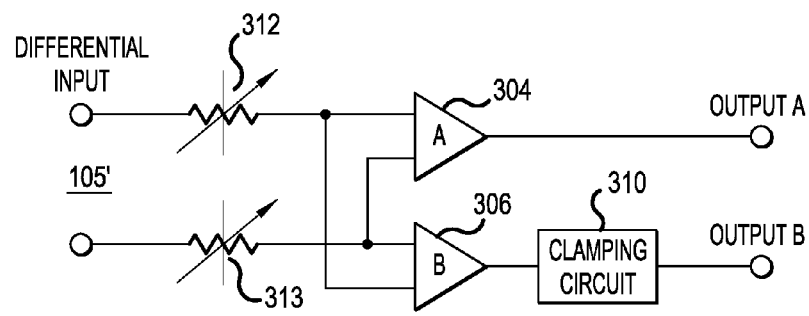

FIG. 3A is a detailed circuit diagram of a dual output high voltage active oscilloscope probe 105 of FIG. 1 according to representative embodiment. FIG. 3B is a detailed circuit diagram of a dual output high voltage active oscilloscope probe 105' according to another representative embodiment.

These diagrams are presented as examples of some of the possible features of a dual output high voltage active oscilloscope probe 105 and a possible signal flow within oscilloscope probe 105. In this example, oscilloscope probe 105 is an active probe.

Referring to FIG. 3A, the oscilloscope probe 105 is a single-ended input probe and includes a voltage attenuator 302. As shown in FIG. 3B, oscilloscope probe 105' is a differential input probe and includes a first attenuator 313 and a second attenuator 313. An attenuator is an electronic device that reduces the amplitude or power of a signal without causing a distortion to its waveform. An attenuator is the opposite of an amplifier. While an amplifier provides gain, an attenuator provides a gain less than 1, or a loss. Attenuators are passive devices which may be made using simple voltage divider networks. Attenuation is expressed in decibels of relative power.

Figure 7:
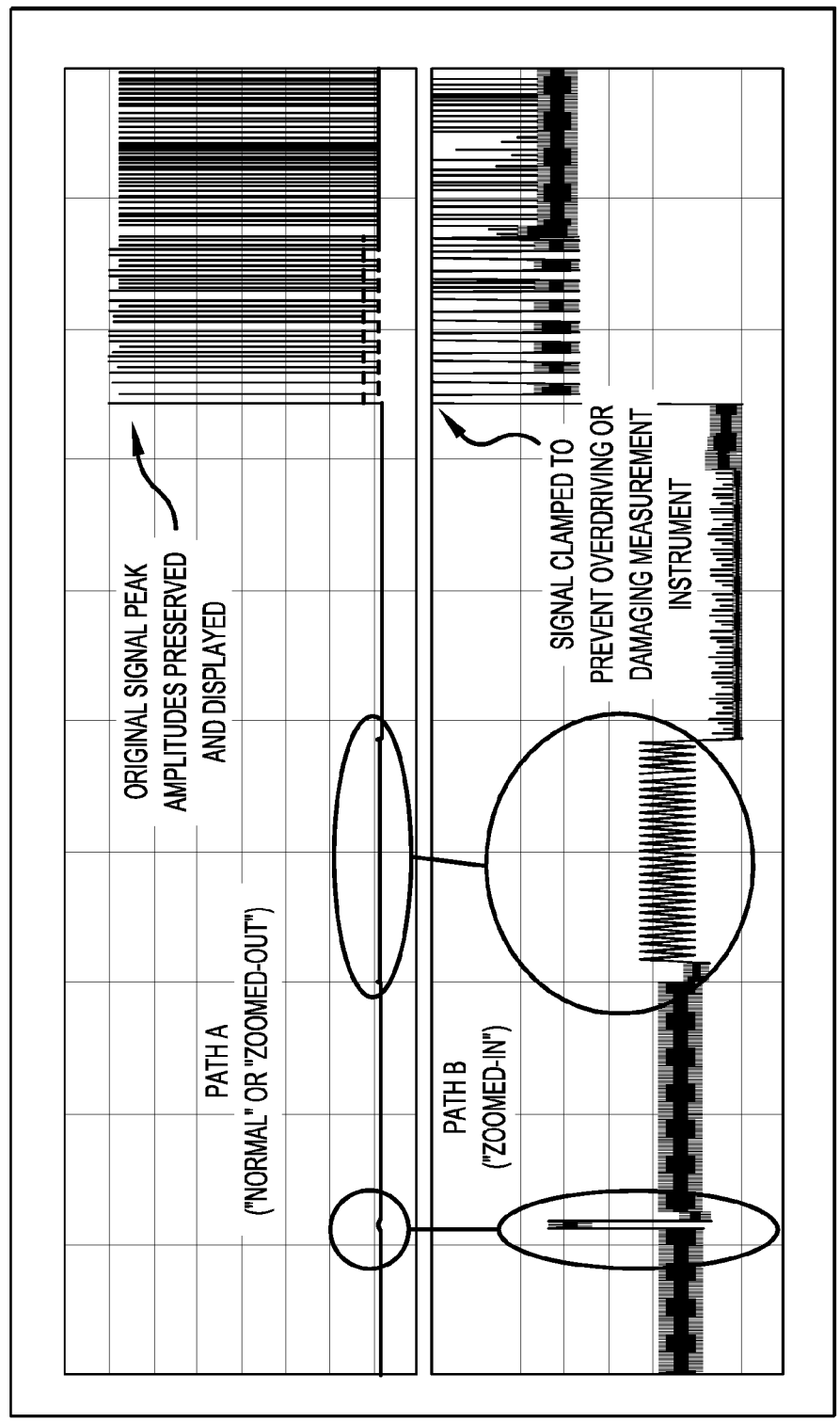
FIG. 7 is an example of a screen shot of the display of the oscilloscope of FIG. 1 according to a representative embodiment.

Oscilloscope probe 105, and 105', includes two paths A and B, for example, to be connected to two oscilloscope channels A and B. Channel A is used for observing an input signal at a broad scale (i.e., a "zoomed out" scale) and channel B is used for observing small portions of the input signal on a magnified scale ("zoomed in" scale), for example, as illustrated in the screen capture of display 115 shown in FIG. 7. A probe amplifier 304 receives the input signal via attenuator 302 through a single lead (FIG. 3A) or via attenuators 313, 313 through a pair of probe leads (FIG. 3B) connected to a DUT 205. The input signal is transmitted to the respective channels A and B through amplifiers 304 and 306. The amplifiers 304 and 306 may have different gains and/or different bandwidths to enhance or optimize low current level SNR. To prevent channel B from being overdriven or saturated by signals output through the higher gain differential amplifier, clamping circuit 310 is placed at the output of this amplifier 306. As will be discussed below, switching circuits can be added at the outputs of the amplifiers 304 and 306 so the "zoomed out" and "zoomed in" signal paths can be reversed if desired. Additionally, switching circuits can be added so that the clamping circuit 310 can be diverted, thus switching off the clamping behavior.

Clamping circuit 310 clamps the amplified input signal to produce an output signal whose range does not exceed a lower or upper clamping threshold. In certain embodiments, probe amplifier 306 is operated with relatively high gain and low bandwidth to provide output signals having a relatively low signal to noise ratio (SNR). Under these conditions, oscilloscope probe 105 can be used to detect and output signals of relatively small magnitude. At the same time, if the amplified input signal becomes relatively large such that it exceeds the upper and/or lower clamping threshold, clamping circuit 310 will prevent oscilloscope probe 105 from outputting the large signal to oscilloscope 110, thus preventing activation of overdrive protection and the introduction of accompanying distortion.

Although not illustrated in FIGS. 3A and 3B, oscilloscope probe 105 may further comprise mechanisms for adjusting various characteristics of probe amplifiers 304 and 306 and/or clamping circuit 310. For instance, it may comprise mechanisms for lowering the gain of probe amplifier 306 and/or disabling operation of clamping circuit 310 to analyze larger input signals. Additionally, it may comprise mechanisms for adjusting the upper and lower clamping thresholds, e.g., for compatibility with an oscilloscope or process having a different overdrive protection threshold.

So, as described, the representative embodiments herein include the use of a high voltage measurement oscilloscope probe 105 that includes a second output. A second signal path B is routed to a second output connector (e.g. an RF connector) on the oscilloscope probe 105. The second output has a clamping circuit 310 that will limit its output to a range corresponding to the vertical range of the oscilloscope at its highest sensitivity, e.g. approximately 5-10 volts. With an oscilloscope probe 105 equipped in this manner the user will measure the peak voltages using the primary output. The second output will be connected to a second oscilloscope channel. This channel will be able to be set to its highest sensitivity and measure the low level voltage (or high level voltage) without concern for overdriving the input circuitry of the oscilloscope 110.

Figure 4:
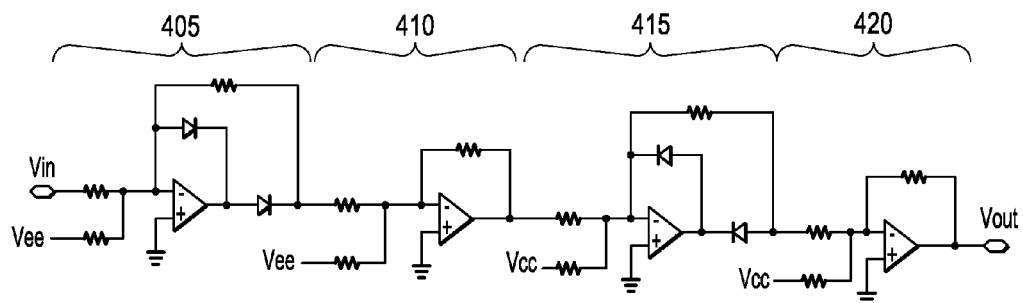
FIG. 4 is a circuit diagram of the clamping circuit of FIGS. 3A and 3B according to a representative embodiment.

FIG. 4 is a circuit diagram of clamping circuit 310 in the oscilloscope probe of FIG. 3 according to a representative embodiment. A general description of clamping circuit 310 will be presented with reference to FIG. 4A, and a more detailed description of individual features of clamping circuit 310 will be presented with reference to FIGS. 5 and 6.

In the examples of FIG. 4, clamping circuit 310 comprises a sequence of sub-circuits that are configured, collectively, to clamp an input signal Vin to produce an output signal Vout bounded by upper and lower clamping thresholds. Referring to FIG. 4, the sub-circuits of clamping circuit 310 comprise a first precision rectifier 405, a first level shifter 410, a second precision rectifier 415, and a second level shifter 420. These circuits are arranged in sequence as illustrated in FIG. 4, and are configured, respectively, to clamp a positive portion of input signal Vin, to perform level shifting in coordination with the positive clamping, to clamp a negative portion of input signal Vin, and to perform level shifting in coordination with the negative clamping. First and second precision rectifiers 405 and 415 each behave like an ideal diode and a rectifier. In the illustrated design, however, each of these precision rectifiers has been modified to include an input resistor that produces a direct current (DC) shift on nonzero output voltages. Each of first and second level shifters 410 and 420 has an input resistor that produces a corresponding DC shift. The values of these input resistors can be adjusted, in a coordinated fashion, to determine the upper and lower clamping thresholds.

Figure 5:
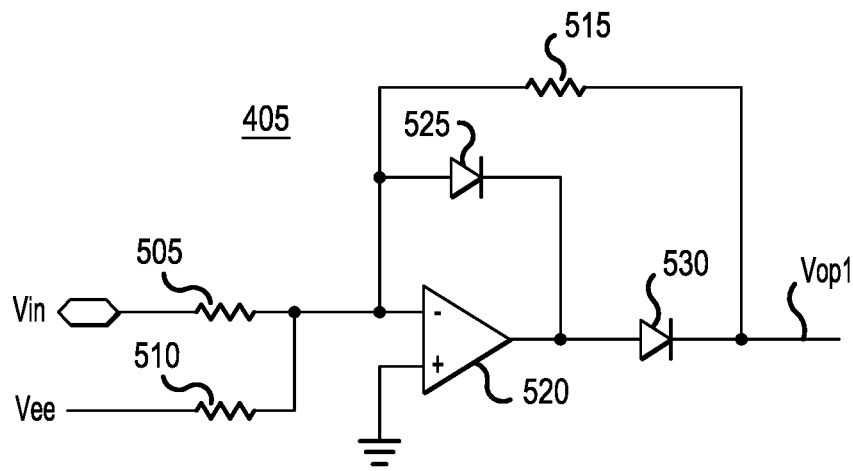
FIG. 5 is a circuit diagram of a first precision rectifier in the clamping circuit of FIG. 4 according to a representative embodiment.

FIG. 5 is a circuit diagram of first precision rectifier 405 in clamping circuit 310 of FIG. 4 according to a representative embodiment.

Referring to FIG. 5, first precision rectifier 405 receives input signal Vin and produces an output signal Vop1. Output signal Vop1 is produced by a combination of shifting, inverting, attenuating, and clamping of input signal Vin. First precision rectifier 405 comprises first, second and third resistors 505, 510 and 515, an operational amplifier (op-amp 520) arranged in an inverting configuration, and first and second diodes 525 and 530. Second resistor 510 is connected to a negative supply voltage Vee, and the remaining features are connected to each other as shown in FIG. 5A.

During typical operation of first precision rectifier 405, input voltage Vin is first modified according to the behavior of an inverting op amp 520 across first resistor 505. The negative supply voltage Vee and second resistor 510 create a DC shift at Vop1. The value of the modified voltage is determined by, among other things, the resistance values of the resistors and the magnitude of negative supply voltage Vee. These and other parameters can be calibrated in combination with other features of clamping circuit 310 to produce the desired operating characteristics. The modified voltage is inverted, clamped, and attenuated by the combination of op-amp 520, third resistor 515, and first and second diodes 525 and 530.

The operation of first precision rectifier 405 clamps all negative voltages at zero, which ultimately results in the clamping of positive portions of input voltage Vin. This clamping also relies on the introduction of a DC offset to input voltage Vin.

Figure 6:
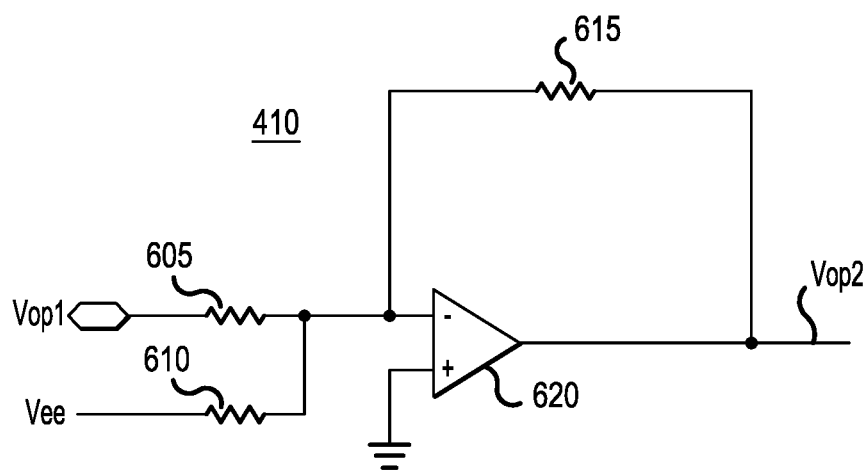
FIG. 6 is a circuit diagram illustrating a first level shifter in the clamping circuit of FIG. 4 according to a representative embodiment.

FIG. 6 is a circuit diagram of first level shifter 410 in clamping circuit 310 of FIG. 4 according to a representative embodiment.

Referring to FIG. 6, first level shifter 410 receives output signal Vop1 from first precision rectifier 405 and produces an output signal Vop2. Output signal Vop2 is produced by a combination of shifting and inverting of output signal Vop2. First level shifter 410 comprises first, second and third resistors 605, 610 and 615, and an op-amp 620 arranged in an inverting configuration. Second resistor 610 is connected to negative supply voltage Vee, and the remaining features are connected to each other as shown in FIG. 6.

During typical operation first level shifter 410, output voltage Vop1 is first modified according to the behavior of an inverting op amp 620 across third resistor 605. The negative supply voltage Vee and second resistor 610 create a DC shift at Vop2. The value of the modified voltage is determined by, among other things, the resistance values of the resistors and the magnitude of negative supply voltage Vee. These and other parameters can be calibrated in combination with other features of clamping circuit 310 to produce the desired operating characteristics. The modified voltage is inverted and attenuated by the combination of op-amp 620 and third resistor 615.

The basic configuration of second precision rectifier 415 is similar to that of first precision rectifier 405 as described in relation to FIG. 5, except that the direction of the diodes is reversed, the supply voltage creating a DC shift is positive, and the values of the resistors may be modified as needed to achieve a desired attenuation and DC shift. The operation of such a circuit will be well understood by those skilled in the art based on the above description. These operations are similar to those performed by first precision rectifier 405, except that they produce clamping on portions of output signal Vop2 that correspond to negative voltages in input signal Vin.

The basic configuration of second level shifter 420 is similar to that of first level shifter 410 as described in relation to FIG. 6, except that the values of the resistors may be modified as needed to achieve a desired DC shift. The operation of such a circuit will be well understood by those skilled in the art based on the above description. The operation of second level shifter 420 scales output signal Vop3 to the level of the upper and lower clamping thresholds.

Figure 8A:
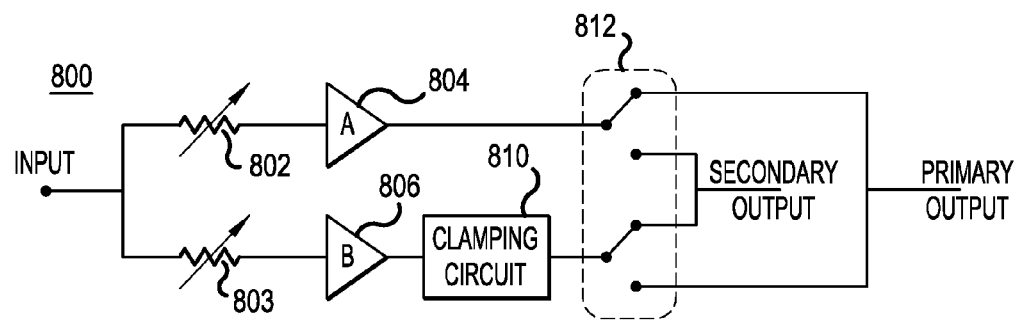
FIGS. 8A and 8B are detailed circuit diagrams of an oscilloscope probe of FIG. 1 according to representative embodiments.
Figure 8B:
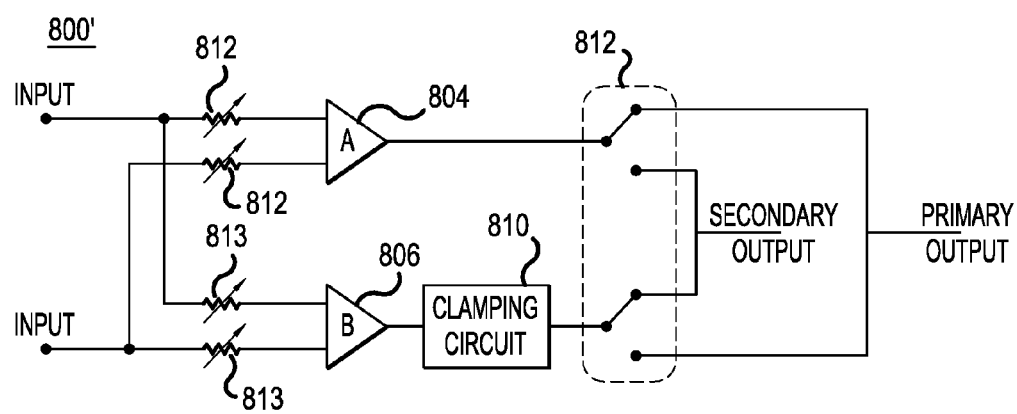

FIGS. 8A and 8B are detailed circuit diagrams of a high voltage measurement oscilloscope probe 800 and 800' according to representative embodiments.

The oscilloscope probe 800 illustrated in FIG. 8A is a single-ended input probe and includes attenuators 802 and 803 in respective signal paths A and B. The oscilloscope probe 800' illustrated in FIG. 8B is a differential input probe and includes pairs of attenuators 812 and 813 in respective signal paths A and B. Probe amplifiers 804 and 806 receive the attenuated input signal in the respective signal paths A and B. The amplifiers 804 and 806 may have different gains and/or different bandwidths to enhance or optimize low current level SNR. To prevent channel B from being overdriven or saturated by signals output through the higher gain differential amplifier, clamping circuit 810 is placed at the output of the amplifier 806.

So, oscilloscope probe 800, and 800', includes two paths A and B, for example, to be connected to two oscilloscope channels A and B. Channel A is used for observing an input signal at a broad scale (i.e., a "zoomed out" scale) and channel B is used for observing small portions of the input signal on a magnified scale ("zoomed in" scale), for example, as illustrated in the screen capture of display 115 shown in FIG. 7. Switching circuits 812 are included after the outputs of the amplifiers 804 and 806 so the "zoomed out" and "zoomed in" signal paths can be reversed if desired.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium, supplied together with or as part of other hardware, but may also be distributed in other forms, such as via the Internet or other wired or wireless telecommunication systems, for example, as discussed above.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A high-voltage active measurement probe for a measurement instrument, the high voltage active measurement probe comprising:
   an input terminal configured to receive an input signal from a device under test (DUT);
   a first output terminal configured to transmit a first output signal to the measurement instrument for measurement and display of peak voltages;
   a second output terminal configured to transmit a second output signal to the measurement instrument for high sensitivity measurement and display of low level voltages;
   a first probe signal path between the input terminal and the first output terminal;
   a second probe signal path between the input terminal and the second output terminal;
   a first amplifier in the first probe signal path between the input terminal and the first output terminal;
   a second amplifier in the second probe signal path between the input terminal and the second output terminal;
   a first attenuator in the first probe signal path between the input terminal and the first amplifier;
   a second attenuator in the second probe signal path between the input terminal and the second amplifier; and
   a clamping circuit in the second signal path between the second amplifier and the second output terminal and configured to clamp an internal probe signal between an upper clamping threshold and a lower clamping threshold to produce the second output signal.

2. The high-voltage active measurement probe of claim 1, wherein the measurement instrument is an oscilloscope.

3. The high-voltage active measurement probe of claim 1, wherein the upper clamping threshold corresponds to a positive voltage level and the lower damping threshold corresponds to a negative voltage level.

4. The high-voltage active measurement probe of claim 3, wherein the clamping circuit comprises:
   a first precision rectifier configured to clamp a positive voltage portion of the internal probe signal to produce a first intermediate signal;
   a first level shifter configured to adjust a direct current (DC) bias of the first intermediate signal to produce a second intermediate signal;
   a second precision rectifier configured to clamp a negative voltage portion of the internal probe signal to produce a third intermediate signal; and
   a second level shifter configured to adjust a DC bias of the third intermediate signal to produce the second output signal.

5. The high-voltage active measurement probe of claim 4, wherein each of the first precision rectifier, the first level shifter, the second precision rectifier, and the second level shifter comprises an amplifier arranged in an inverting configuration.

6. The high-voltage active measurement probe of claim 4, wherein the first precision rectifier is configured to perform clamping on the positive voltage portion by adjusting a DC bias of the internal probe signal, inverting the internal probe signal, and clamping a negative voltage portion of the adjusted and inverted internal probe signal.

7. The high-voltage active measurement probe of claim 1, further comprising an additional input terminal coupled to each of the first and second probe signal paths, and together with the input terminal defining a differential input.

8. The high-voltage active measurement probe of claim 1, wherein the first amplifier has a first gain and a first bandwidth, and the second amplifier has a second gain higher than the first gain and a second bandwidth lower than the first bandwidth.

9. The high-voltage active measurement probe of claim 1, further comprising switch circuitry coupled to the first and second probe signal paths to selectively switch the first and second output terminals therebetween.

10. A measurement system, comprising:
   a measurement instrument comprising at least first and second channel inputs and a display; and
   a high-voltage active measurement probe comprising
      an input terminal configured to receive an input signal from a device under test (DUT);
      a first output terminal configured to transmit a first output signal to the first channel input of the measurement instrument for measurement and display of peak voltages;
      a second output terminal configured to transmit a second output signal to the second channel input of the measurement instrument for high sensitivity measurement and display of low level voltages;
      a first probe signal path between the input terminal and the first output terminal;
      a second probe signal path between the input terminal and the second output terminal;
      a first amplifier in the first probe signal path between the input terminal and the first output terminal;
      a second amplifier in the second probe signal path between the input terminal and the second output terminal;
      a first attenuator in the first probe signal path between the input terminal and the first amplifier;
      a second attenuator in the second probe signal path between the input terminal and the second amplifier; and
      a clamping circuit in the second signal path between the second amplifier and the second output terminal and configured to clamp an internal probe signal between an upper clamping threshold and a lower clamping threshold to produce the second output signal.

11. The measurement system of claim 10, wherein the measurement instrument is an oscilloscope, and the high-voltage active measurement probe is a high-voltage active oscilloscope probe.

12. The measurement system of claim 10, wherein the first amplifier has a first gain and a first bandwidth, and the second amplifier has a second gain higher than the first gain and a second bandwidth lower than the first bandwidth.

13. The measurement system of claim 10, wherein the upper clamping threshold corresponds to a positive voltage level and the lower clamping threshold corresponds to a negative voltage level.

14. The measurement system of claim 13, wherein the clamping circuit comprises:
   a first precision rectifier configured to clamp a positive voltage portion of the internal probe signal to produce a first intermediate signal;
   a first level shifter configured to adjust a direct current (DC) bias of the first intermediate signal to produce a second intermediate signal;
   a second precision rectifier configured to clamp a negative voltage portion of the internal probe signal to produce a third intermediate signal; and
   a second level shifter configured to adjust a DC bias of the third intermediate signal to produce the second output signal.

15. The measurement system of claim 14, wherein the first precision rectifier is configured to perform clamping on the positive voltage portion by adjusting a DC bias of the internal probe signal, inverting the internal probe signal, and clamping a negative voltage portion of the adjusted and inverted internal probe signal.

16. The measurement system of claim 10, wherein the high-voltage active measurement probe further comprises an additional input terminal coupled to each of the first and second probe signal paths, and together with the input terminal defining a differential input.

17. A method of operating a high-voltage active measurement probe, the method comprising:
   positioning the high-voltage active measurement probe and receiving an input signal from a device under test (DUT);
   processing the input signal along a first probe signal path, including attenuation and amplification, to produce a first output signal to a measurement instrument for measurement and display of peak voltages; and
   processing the input signal along a second probe signal path, including attenuation, amplification and clamping of an internal probe signal between an upper clamping threshold and a lower clamping threshold, to produce a second output signal to the measurement instrument for high sensitivity measurement and display of low level voltages.

18. The method of claim 17, wherein processing the input signal to produce the first output signal further comprises transmitting the input signal through the first probe signal path including a first attenuator and a first amplifier; and wherein processing the input signal to produce the second output signal further comprises transmitting the input signal through the second probe signal path including a second attenuator, a second amplifier having higher gain and lower bandwidth than the first amplifier, and clamping circuit.

19. The method of claim 17, wherein the clamping comprises:
   inverting the input signal and shifting a direct current (DC) bias of the input signal;
   clamping a negative portion of the inverted and shifted input signal to produce a first intermediate signal;
   inverting the first intermediate signal and shifting a DC bias of the inverted first intermediate signal to produce a second intermediate signal;
   inverting the second intermediate signal and shifting a DC bias of the second intermediate signal;
   clamping a positive portion of the inverted and shifted second intermediate signal to produce a third intermediate signal; and
   inverting the third intermediate signal and shifting a DC bias of the inverted third intermediate signal.

20. The method of claim 17, wherein the high-voltage active measurement probe further comprises first and second input terminals coupled to each of the first and second probe signal paths, and together defining a differential input.

* * * * *